United States Patent
Tian et al.

(10) Patent No.: US 7,994,027 B2
(45) Date of Patent: Aug. 9, 2011

(54) MICROWAVE HEATING FOR SEMICONDUCTOR NANOSTRUCTURE FABRICATION

(75) Inventors: Yonglai Tian, Fairfax, VA (US); Rao V. Mulpuri, Fairfax Station, VA (US); Siddharth G. Sundaresan, Vienna, VA (US); Albert V. Davydov, North Potomac, MD (US)

(73) Assignees: George Mason Intellectual Properties, Inc., Fairfax, VA (US); NIST, Washington, DC (US)

( * ) Notice: Subject to any disclaimer, the term of this patent is extended or adjusted under 35 U.S.C. 154(b) by 0 days.

(21) Appl. No.: 12/463,942

(22) Filed: May 11, 2009

(65) Prior Publication Data
US 2010/0068871 A1    Mar. 18, 2010

Related U.S. Application Data

(60) Provisional application No. 61/051,902, filed on May 9, 2008.

(51) Int. Cl.
*H01L 21/20* (2006.01)
*C30B 23/00* (2006.01)

(52) U.S. Cl. ............... 438/478; 438/931; 117/84
(58) Field of Classification Search ............... None
See application file for complete search history.

(56) References Cited

U.S. PATENT DOCUMENTS

| 5,363,800 | A * | 11/1994 | Larkin et al. ............ 438/507 |
| 6,214,108 | B1 * | 4/2001 | Okamoto et al. ............ 117/95 |
| 7,569,800 | B2 | 8/2009 | Tian |
| 2003/0070611 | A1 * | 4/2003 | Nakamura et al. ............ 117/109 |
| 2004/0144301 | A1 * | 7/2004 | Neudeck et al. ............ 117/86 |
| 2005/0000406 | A1 * | 1/2005 | Janzen et al. ............ 117/81 |
| 2008/0083366 | A1 * | 4/2008 | Basceri et al. ............ 117/84 |
| 2009/0056619 | A1 * | 3/2009 | Mueller et al. ............ 117/99 |

OTHER PUBLICATIONS

Sundaresan et al. Growth of Silicon Carbide Nanowires by a Microwave Heating-Assisted Physical Vapor Transport Process Using Group VIII Metal Catalysts, Chem. Mater., 2007, 19, pp. 5531-5537, published on Web Oct. 16th , 2007.*

Siddarth G. Sundaresan, Comparison of Solid-State Microwave Annealing with Conventional Furnace Annealing of Ion-Implanted SiC, Journal of Electronic Materials, vol. 36, No. 4, 2007.

* cited by examiner

*Primary Examiner* — Scott B Geyer
(74) *Attorney, Agent, or Firm* — David Grossman; David Yee

(57) ABSTRACT

The present invention grows nanostructures using a microwave heating-based sublimation-sandwich SiC polytype growth method comprising: creating a sandwich cell by placing a source wafer parallel to a substrate wafer, leaving a small gap between the source wafer and the substrate wafer; placing a microwave heating head around the sandwich cell to selectively heat the source wafer to a source wafer temperature and the substrate wafer to a substrate wafer temperature; creating a temperature gradient between the source wafer temperature and the substrate wafer temperature; sublimating Si- and C-containing species from the source wafer, producing Si- and C-containing vapor species; converting the Si- and C-containing vapor species into liquid metallic alloy nanodroplets by allowing the metalized substrate wafer to absorb the Si- and C-containing vapor species; and growing nanostructures on the substrate wafer once the alloy droplets reach a saturation point for SiC. The substrate wafer may be coated with a thin metallic film, metal nanoparticles, and/or a catalyst.

20 Claims, 12 Drawing Sheets

(a)

MSELS4700 10.0kV 7.9mm x 80.0k SE(U) 11/25/2006 21:51 500nm (b)

(c)

MICROWAVE HEATING FOR SEMICONDUCTOR NANOSTRUCTURE FABRICATION

CROSS REFERENCE TO RELATED APPLICATIONS

The present application claims the benefit of provisional patent application Ser. No. 61/051,902 to Sundaresan et al., filed on May 9, 2008, entitled "Nanowire Growth Using Microwave Heating-Assisted Physical Vapor Transport," which is hereby incorporated by reference.

STATEMENT REGARDING FEDERALLY SPONSORED RESEARCH OR DEVELOPMENT

This invention was made with government support under grant W911NF-04-1-0428 awarded by the Army Research Office; SBIR grant no. 0539321 awarded by National Science Foundation (NSF); grant no. DMR 05-20471 awarded by NSF UMD MRSEC; and award nos. ECS-0618948 and ECCS-0742139 both awarded by NSF. The government has certain rights in the invention.

BACKGROUND OF THE INVENTION

Over the past decade, one dimensional (1D) semiconductor nanostructures, such as nanotubes and nanowires, have attracted special attention due to their high aspect and surface to volume ratios, small radius of their tips, absence of three dimensional (3D) growth related defects, such as threading dislocations, and fundamentally new electronic properties resulting from quantum confinement. These nanostructures can be used as building blocks for future nanoscale electronic devices and nanoelectromechanical systems (NEMS), designed using a bottom-up approach. A variety of 1D nanowires of Si, ZnO, SiC and other semiconductors have been synthesized.

Taking SiC as an example, SiC offers opportunities in fabricating nanoelectronic devices and NEMS for chemical/biochemical sensing, high-temperature, high-frequency and aggressive environment applications. These opportunities are due to wide bandgap, high electric breakdown field, mechanical robust, chemical inertness and biocompatibility.

However, before any of the above-mentioned applications could be realized, a reliable technique for the high yield, cost effective fabrication of SiC nanostructures with controlled morphology (size, shape, location, and orientation), structure (polytype and defects) and electronic properties (doping level and transport) needs to be developed. Currently, post-growth processing and manipulation of nanostructures is an extremely difficult task.

Several known techniques have been applied to synthesize SiC nanowires using physical evaporation, chemical vapor deposition, laser ablation, direct chemical reaction, etc. However, such existing growth methods for synthesis of SiC nanostructures exhibit several problems and limitations. First, all of the existing methods can grow only 3C—SiC polytype nanowires, while methods for selective growth of other polytype, such as hexagonal 4H and 6H—SiC nanowires, have not yet been developed. It is known that the hexagonal SiC polytypes have many advantageous properties over 3C—SiC, such as larger bandgap, lower intrinsic carrier concentration, higher hole mobility and higher breakdown voltage, etc. The lack of the ability to fabricate hexagonal SiC polytype nanowires is a significant draw back for the use of SiC nanowires in many important applications.

Second, the growth of SiC nanostructures using the above-mentioned conventional methods is very slow (in the μm range per hour), and the morphology of the SiC nanostructures are uncontrollable. Different sizes and shapes of nanostructures, such as nanowires, nanoribbons, nanosaws and two dimensional (2D) or 3D features, are often present in the same sample. Consequently, the 1D nanostructures with desired morphologies and properties constitute just a fraction of the total yield. The slow growth rate and low yield of desired nanostructures become critical technical barriers for the practical applications of the existing growth methods in terms of large quantity and low-cost fabrication of SiC nanostructures.

Consequently, what is needed is a simpler and more effective technique to overcome the above mentioned technical barriers in order to open the doors for high-yield, cost-effective growth of nanowires (e.g., SiC nanowires, etc.) with selected polytype, morphology, and properties.

DETAILED DESCRIPTION OF THE INVENTION

The present invention embodies novel microwave heating techniques for developing high yield, controlled growth of nanostructures with well defined morphology, polytypes and properties. In one embodiment, the present invention embodies the growth of silicon carbide (SiC) nanostructures.

Figure 1:
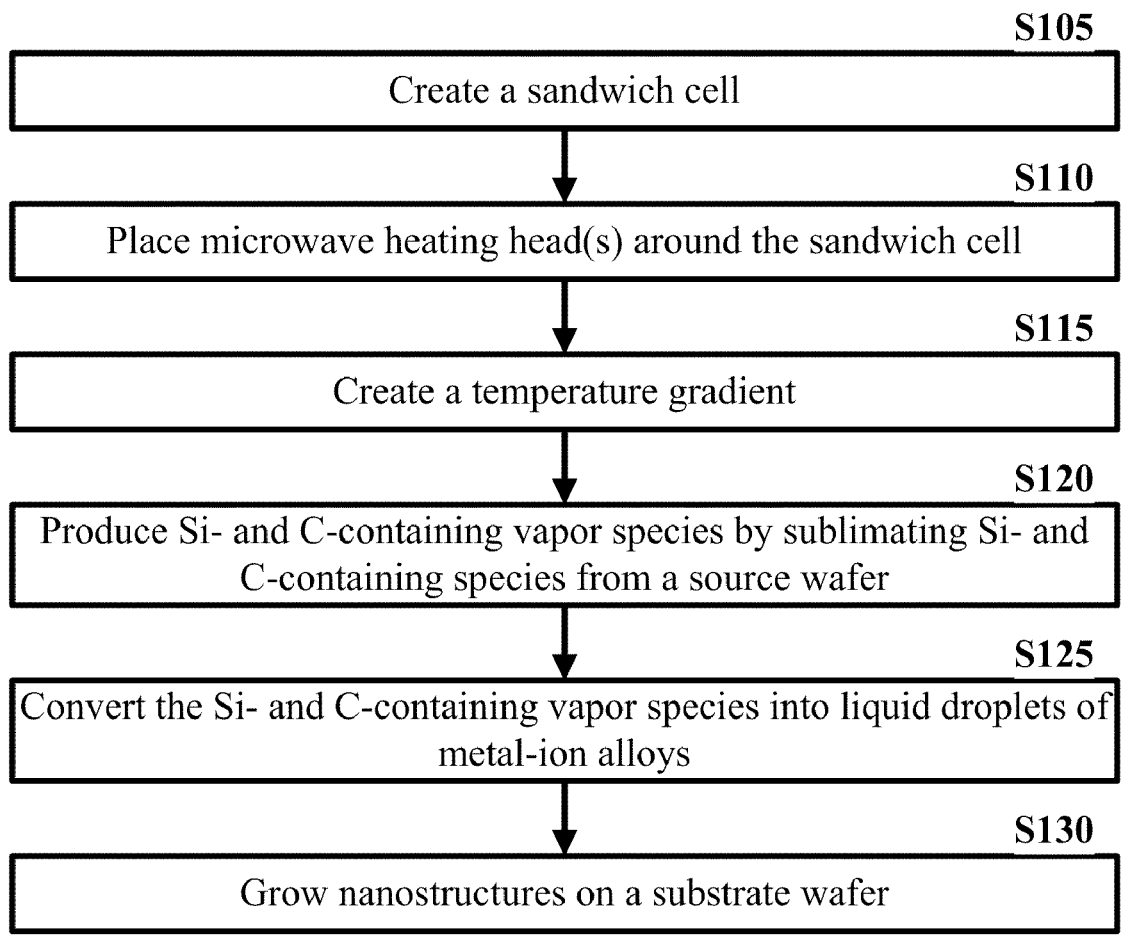
FIG. 1 shows a flow diagram of a microwave-based sublimation-sandwich SiC nanostructure growth method as per one aspect of the present invention.

Referring to FIG. 1, a microwave-based sublimation-sandwich SiC polytype growth method is shown. Carried out in a modified solid-state microwave (SSM) system (as described herein), the method comprises the following. One, a sandwich cell is created by placing a source wafer parallel to a substrate wafer, leaving a small gap between the source wafer and the substrate wafer S105. Two, a microwave heating head is placed around the sandwich cell to selectively heat the source wafer to a source wafer temperature and the substrate wafer to a substrate wafer temperature S110. Three, a temperature gradient between the source wafer temperature and the substrate wafer temperature is created S115. Four, silicon (Si-) and carbon (C-) containing species sublimate from the source wafer, producing Si- and C-containing vapor species S120. Five, the Si- and C-containing vapor species are converted into liquid metallic alloy droplets (which may be nanodroplets) by allowing the substrate wafer to absorb the Si- and C-containing vapor species S125. Six, nanostructures are grown on the substrate wafer once the alloys reach a saturation point for SiC S130.

In another embodiment, the present invention similarly discloses a sublimation-sandwich SiC polytype growth method. This method comprises (a) creating a sandwich cell by placing a source wafer parallel to a substrate wafer, leaving a small gap between the source wafer and the substrate wafer; (b) placing a heating unit around the sandwich cell to selectively heat the source wafer to a source wafer temperature and the substrate wafer to a substrate wafer temperature; (c) creating a temperature gradient between the source wafer temperature and the substrate wafer temperature; (d) sublimating silicon (Si-) and carbon (C-) containing species from the source wafer, producing Si- and C-containing vapor species; (e) converting the Si- and C-containing vapor species into liquid droplets of metal-ion alloys by allowing the substrate wafer to absorb the Si- and C-containing vapor species; and (f) growing nanostructures on the substrate wafer once the alloys reach a saturation point for SiC.

For each of these methods, the following embodiments apply to the present invention.

The SiC polytype can be hexagonal SiC (e.g., 4H—SiC, 6H—SiC, etc.) or a cubic SiC (e.g., 3H—SiC), or any other type. The source wafer may be an n-type or p-type doped SiC. The substrate wafer may be a semi-insulating SiC. Alternatively, the substrate wafer may be an at least one order less doped SiC, as compared to the source wafer. For instance, if the source wafer is doped to $10^{19}$ dopant atoms/cm$^3$, then the substrate wafer is doped to less than or about equal to $10^{18}$ dopant atoms/cm$^3$. The small gap between the wafers can be at least about 0.3 mm. It should be noted that polytype growth means growing one or more different polytypes.

N-type (where "n" means negative) and p-type (where "p" means positive) are terms generally associated with doping of semiconductors. Doping is commonly known as a process of intentionally introducing trace amounts of one or more elements (namely, one or more impurities) to a pure semiconductor to alter the electrical properties of the semiconductor. For n-type doping, there needs to be at least one unbounded valence electron in the semiconductor. For p-type doping, there needs to be at least one covalent bond being deficient in electrons.

Take silicon as a semiconductor example. Silicon has four valence electrons, which are used to form covalent bonds to other atoms. To create n-type doping, an impurity (an element) having five or more valence electrons (e.g., a Group VA element, such as arsenic) may be added to the silicon. When covalent bonds are formed with the impurity, there will be at least one valence electron that does not form a covalent bond. The extra electron(s) creates a negative charge as it moves through the solid under an applied voltage.

To create p-type doping, an impurity having three or less valence electrons (e.g., a Group IIIA element, such as boron (B)) may be added to the silicon. For each impurity added, at least one of the covalent bonds from the silicon will be deficient in electrons because it has less than four valence electrons. When covalent bonds are formed with the impurity, one or more electrons from a neighboring atom can move over to fill this deficiency, leaving a positive "hole" behind. Such hole can be filled by another electron from another atom. However, the effect of that migration still results in another hole. As such, under applied voltage, the missing electron(s) create a positive charge.

The inner surface of the substrate wafer is coated with a catalyst. Such coating creates a catalyst layer. The catalyst may be a metal catalyst. Nonlimiting examples of metal catalysts include iron (Fe), nickel (Ni), palladium (Pd), platinum (Pt), etc. The catalyst layer may be a patterned layer. For instance, the catalysts may be placed in a checkerboard pattern, circular pattern, rectangular or other polygonal pattern, linear pattern, etc. Catalysts may also be placed randomly.

The sandwich cell and the microwave heating head may be placed in a vacuum chamber. Alternatively, they may be placed in a dopant gas atmosphere. A dopant gas includes nitrogen, borine, phosphine, etc., or it can be any gas having a dopant as a constituent element.

It should be noted that throughout the present invention, one or more microwave heating heads can be used. The mere mentioning of the term "microwave heating head" in the singular sense does not mean that the present invention is limited to using only one microwave heating head.

In addition to the microwave heating head, which is known in the art, the present invention can also use any other known heating unit. For example, the heating unit may be a laser annealing system (such as LA-TF or Laser Anneal 6300, both by AMBP Tech of Piscataway, N.J.). In yet another example, the heating unit may be a halogen or mercury lamp.

While these heating units are known, the present invention's doped GaN annealing techniques remain novel. It is within the scope of the present invention that such annealing techniques include, but is not limited to, microwave heating annealing, laser annealing, halogen lamp annealing, mercury lamp annealing, etc. Although the following embodiments use microwave heating annealing as an example, any of these exemplified techniques may be used to achieve the requisite high heating rates and temperatures of the present invention.

The method may further include controlling the morphology of the nanostructures by varying the substrate wafer temperature and the temperature gradient. Morphology refers to shape, size, and/or location. Nanostructures refer to a type of structure that is nano-sized. For instance, the morphological shape (structure) of a nanostructure can be a nanowire, nanocone, nanorod, nanoneedle, 2D nanostructure, 3D nanostructure, etc.

Additionally, the method may include controlling the SiC polytype growth by varying the substrate wafer temperature and polarity of the substrate wafer. The polarity may be either Si-face or C-face. Moreover, the method may include controlling the SiC polytype growth by varying vapor phase composition. The vapor phase composition may include an Si/C molar ratio in ambient and at least one impurity.

In yet another embodiment, the present invention further includes controlling the morphology of the nanostructures by selecting a source wafer with at least one dopant. Nonlimiting examples of the dopant include aluminum, nitrogen, etc.

The substrate wafer temperature should be greater than or about equal to the melting point of the catalyst, and the temperature gradient may be at least about 100° C. Furthermore, a heating rate should be at least about 100° C./s and a cooling rate should be at least about 100° C./s. Having a high heating rate and cooling rate is beneficial for the fast growth and high yield of nanostructures (e.g., nanowires, nanocones, nanorods, nanoneedles, etc.).

The saturation point refers to the maximum amount of Si and C that the substrate wafer can absorb after the catalyst melts. This absorption is dependent upon the temperature of the liquid droplets of the metal-ion alloys. These metal-ion alloys may be formed by combining ions from the catalyst, the SiC polytype, and/or the substrate wafer.

I. INTRODUCTION

SiC belongs to a class of semiconductors known as wide band-gap semiconductors. SiC is a wide band gap semiconductor that possesses high thermal conductivity, high breakdown electric field, and chemical and mechanical stability. Because of these properties, SiC devices can perform under high-temperature, high-power, and/or high-radiation conditions in which conventional (e.g., narrow band gap) semiconductors cannot adequately perform. The ability of SiC to function under extreme conditions is expected to enable significant improvements to a far ranging variety of applications and systems. SiC power devices have improved high-voltage switching characteristics compared with conventional semiconductors, such as like Si and GaAs. Applications of high-power SiC devices range from public electric power distribution and electric vehicles to more powerful SSM sources for radar and communications to sensors and controls for cleaner-burning, more fuel-efficient, jet aircraft and automobile engines.

SiC offers opportunities in fabricating nanoelectric devices and NEMS for chemical/biochemical sensing, as well as high-temperature, high frequency, and/or aggressive environment applications. These opportunities may be due to wide bandgap, high electric breakdown field, mechanical robustness, chemical inertness, and/or biocompatibility.

As indicated in the following table, TABLE 1 shows a comparison of material properties of several semiconductors, namely Si, GaAs, and SiC.

TABLE 1

Material Properties of Semiconductors Si, GaAs, and SiC

| Attribute | Si | GaAs | 4H—SiC |
|---|---|---|---|
| Energy Gap (eV) | 1.11 | 1.43 | 3.2 |
| Breakdown E-Field (V/cm) | $6.0 \times 10^5$ | $6.5 \times 10^5$ | $3.5 \times 10^6$ |
| Saturation Velocity (cm/s) | $1.0 \times 10^7$ | $2.0 \times 10^7$ | $2.0 \times 10^7$ |
| Electron Mobility (cm$^2$/V-s) | 1350 | 6000 | 800 |
| Thermal Conductivity (W/cmK) | 1.5 | 0.46 | 3.5 |
| Heterostructures | SiGe/Si | AlGaAs/GaAs InGaP/GaAs AlGaAs/ InGaAs | None |

Figure 2:
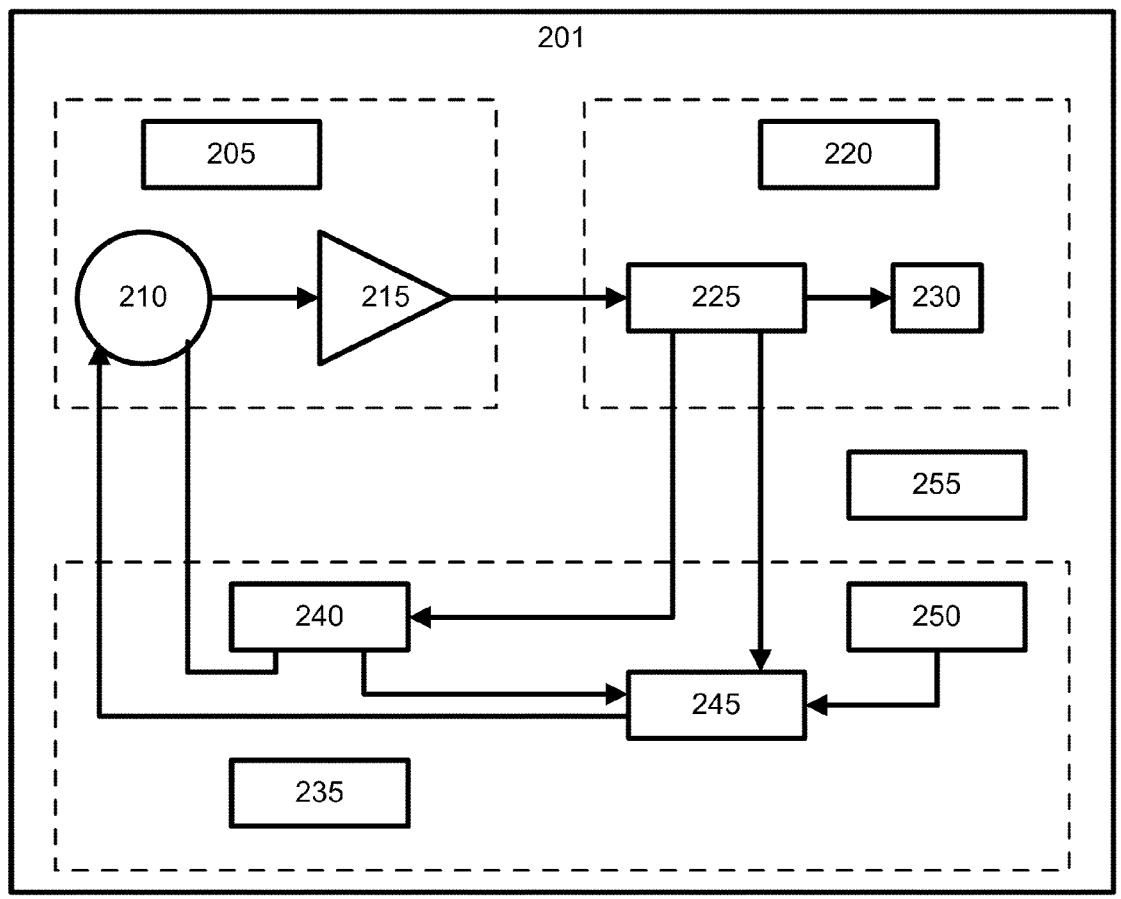
FIG. 2 shows an example of a block diagram of a solid-state microwave annealing system.
Figure 3:
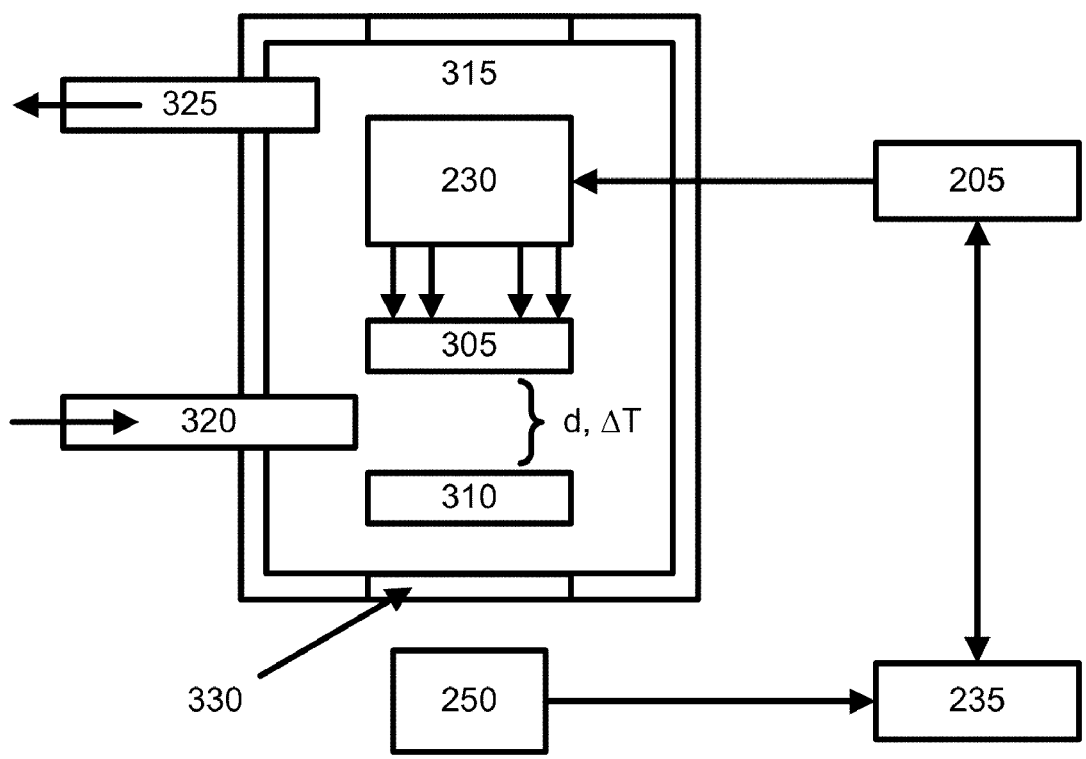
FIG. 3 shows another example of a block diagram of a solid-state microwave annealing system.

An example of a SSM RTP system 201 used in this work is illustrated in FIG. 2 and FIG. 3. This SSM RTP system has three main building blocks: (1) a variable frequency microwave solid state power source 205, which consists of a signal generator 210 and a power amplifier 215, (2) a microwave heating system 220, which consists of a coupling and tuning circuit 225 and at least one microwave heating head 230, 315, for coupling microwave power to the targeted source wafer having a T1 305 and (3) a measurement and control system 235, which consists of a network analyzer 240, a computer 245, an optical pyrometer 250, and other equipment. Below the targeted source wafer having a T1 305 and separated by a small gap is the substrate wafer having a T2 310. The temperature difference between T1 and T2 forms the temperature gradient ΔT. Microwave power generated by the variable frequency power source 205 is amplified and then coupled to a SiC sample 255, 310 through the microwave heating head 230. The environmental gas and pressure of the chamber can be controlled by vacuum pump 325 and external vapor/gas source 320. The sample temperature can be monitored through a viewport 330 by an infrared pyrometer or the optical pyrometer 250. The SiC sample emissivities can be measured using a blackbody source. The measured emissivity value (e.g., 0.8) is then keyed into the pyrometer for all temperature measurements.

Figure 4:
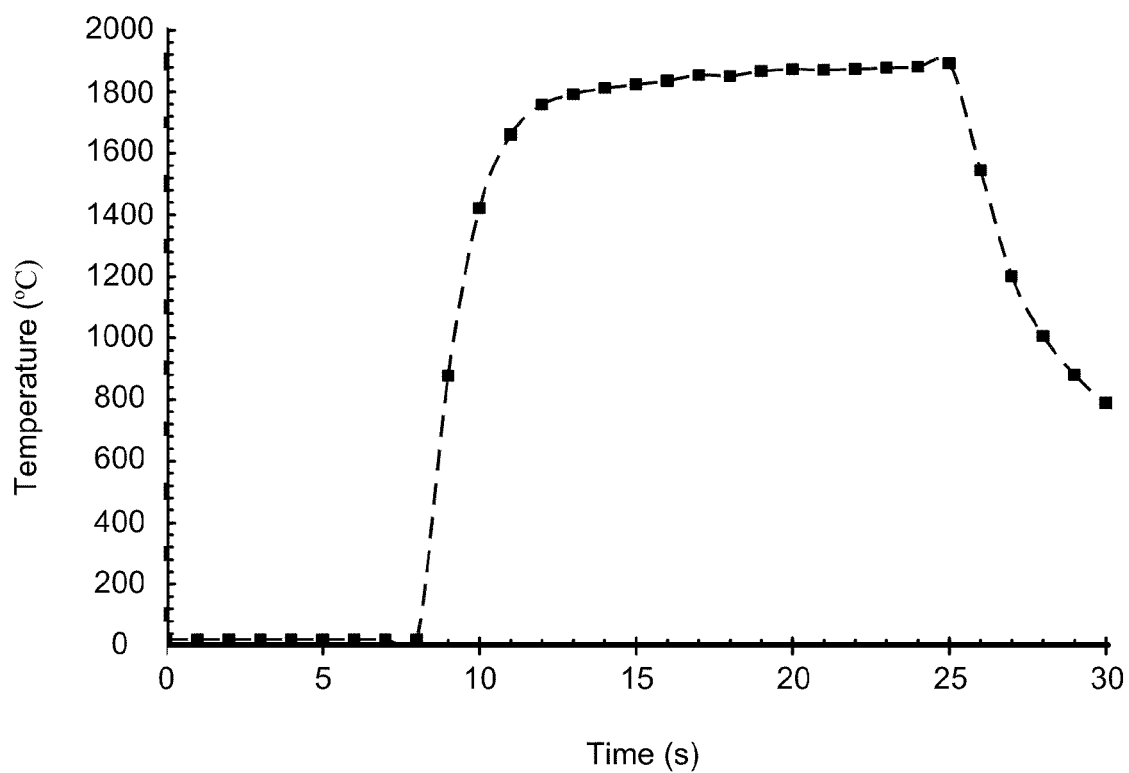
FIG. 4 shows an example of a typical heating cycle, where the sample is 4H—SiC, the applied microwave power is 104 W, and the steady state temperature is ~1800° C. and maintained for about 15 s.

The microwave system 315 above can be tuned to efficiently heat semiconductor samples at variable frequencies. For instance, operating at about 150 W, the frequency may range from about 910 MHz to about 930 MHz. A typical temperature/time cycle of this system for heating 5 mm×5 mm heavily (in-situ) doped 4H—SiC is shown in FIG. 4. In this figure, the sample used was 4H—SiC. The applied microwave power was 104 W. The steady state temperature of ~1800° C. was maintained for about 15 seconds.

Since samples should be placed in an enclosure made of microwave transparent, high-temperature stable ceramics (such as boron nitride and mullite), microwaves only heat the strong microwave absorbing (electrically conductive) semiconducting films, which present a very low thermal mass in comparison with a conventional furnace where the surroundings of the sample are also heated. Thus, heating rates>600° C./s are possible.

Microwave heating has an advantage of selective heating. When microwave power radiates on two different materials, such as a highly doped SiC wafer (which tends to be a strong microwave absorber), and a semi-insulating SiC wafer (which tens to be a poor microwave absorber), microwaves may selectively heat up highly doped SiC of the strong microwave absorber while leaving a negligible direct, heating effect on the semi-insulating SiC.

II. GROWING SiC NANOWIRES BY A MICROWAVE BASED SUBLIMIATION—SANDWICH METHOD

A. Introduction

A new method for the growth of SiC nanowires by a novel catalyst-assisted sublimation-sandwich (SS) method was developed. It is a simple and effective approach to grow SiC nanowires by combining the advantages of physical vapor transport (PVT) process and catalytic vapor-liquid-solid (VLS) growth mechanism. As one exemplary embodiment, for heating, an ultra-fast microwave heating technique developed by LT technologies is employed. Different morphologies of 1-D SiC nanostructures may be grown by appropriately adjusting the process parameters. The as-grown nanowires were characterized using FESEM, energy dispersive x-ray spectroscopy (EDAX), electron backscattered diffraction (EBSD), transmission electron microscopy (TEM), and micro-Raman spectroscopy.

Novel features of this SS method include, but are not limited to, fast growth rate (1-2 μm/s), which is at least 1-3 orders of magnitude higher than any existing method for growing SiC nanowires; potential control of morphology of SiC nanowires including shape, size, location and orientation;

potential control of polytypes and doping concentration of SiC nanowires; and high process yield and low cost.

B. Sublimation-Sandwich Method

1. Nanowire Growth Conditions

The following description pertains to exemplified embodiments of fabricating SiC nanowires using the SS method. In no way does the present invention limits these teachings to SiC nanowires.

The key conditions for high-yield and cost effective fabrication of nanowires (such SiC) are fast growth rate, and controlled shape and size. While these conditions are necessary for SiC, these conditions may also apply to other types of nanowires.

TABLE 2 lists, step by step, all the conditions required to achieve a fast process rate for each step in the sublimation sandwich growth process. It can be seen that two conditions are critical, namely: (1) a high substrate wafer temperature T2, and (2) a high temperature gradient $\Delta T$, with which a fast process rate can be achieved for each step in the sublimation sandwich process and consequently for the overall growth rate. The results from proof-of-concept experiments confirmed that a very high growth rate of 1-2 μm/s can be achieved at T2>1750° C. and $\Delta T$>100° C. This growth rate is about at least 10-100 times faster than those of the current conventional growth methods.

Nevertheless, both results are similar because the growth rate is directly proportional to the temperature gradient. It can be seen that nanocones grow at low T2 and $\Delta T$, nanorods at medium T2 and $\Delta T$, nanoneedles at high T2 and $\Delta T$, and 2D and 3D nanostructures at very high T2 and $\Delta T$.

In addition to T2 and $\Delta T$, fast heating and cooling rate are also necessary because nanowires of undesired shapes may form during ramping up and cooling stages due to the transient temperature variation if the heating and cooling is slow. However, the present invention's microwave heating system has the capability of fast heating and cooling to keep the ramping time short for eliminating the formation of undesired shapes.

Growing different SiC polytypes require certain favorable conditions, as shown in TABLE 4.

TABLE 4

| Conditions Favorable for Growth of Different SiC Nanowire Polytypes | | | |
|---|---|---|---|
|  | 4H—SiC | 6H—SiC | 3C—SiC |
| Substrate Temperature T2 | High | Higher | Relative low |
| Temperature gradient $\Delta T$ | Low | Low | High |
| Polarity of substrate SiC wafer | C-face | Si-Face | Si-face |
| Si/C molar ratio in ambient | C-rich | Si-rich | Excess Si-rich |

TABLE 2

| Conditions Required for Achieving Fast Process Rate for Each Step in the SS Process | | |
|---|---|---|
|  | Steps in SS process | Conditions for fast process rate at each step |
| 1 | Sublimation of SiC from the surface of the source wafer | Vapor phase stoichiometry by congruent source evaporation<br>High T1 for high vapor pressure<br>High $\Delta T$ ($\Delta T$ = T2 − T1) for fast vapor transport |
| 2 | Absorption of vapors by metal (e.g. Fe) catalyst | High T2 for supersaturation of metal-Si—C liquid alloy phase resulted from fast absorption of Si- and C-bearing vapor species by metal-catalyst |
| 3 | Growth of SiC nanowires from Fe(Si,C) liquid droplet | High T2 for fast diffusion of Si and C species in Fe(Si,C) liquid alloy followed by precipitation of SiC nanostructures from this alloy |

In addition to high growth rate, controlling the shape and size is another key for high yield fabrication of nanowires with desired features. Different shapes of SiC nanowires that can be grown include nanocones, nanorods, and nanoneedles. It was observed from the experiments that the two factors that control the shape of SiC nanowires are the substrate wafer temperature T2 and the temperature gradient $\Delta T$, as shown in TABLE 3.

TABLE 3

| Factors to Control the Shape and Morphology of SiC Nanostructures | | | |
|---|---|---|---|
|  | Control of the shape in growth of SiC nanostructure | Substrate wafer T2 | Temperature gradient $\Delta T$ |
| Selectivity of Shape | Nanocones | Low | Low |
|  | Nanorods | Medium | Medium |
|  | Nanoneedles | High | High |
|  | 2D and 3D nanostructures | Very high | Very high |

Similar results have been reported on CVD growth of SiC nanostructures, where the growth rate is used as one of the controlling factors instead of the temperature gradient $\Delta T$.

TABLE 4-continued

| Conditions Favorable for Growth of Different SiC Nanowire Polytypes | | | |
|---|---|---|---|
|  | 4H—SiC | 6H—SiC | 3C—SiC |
| Presence of certain impurities/doping | N, Ge, Sn | | |
| Polytypes of SiC substrate wafer | Independent | | |

Overall, with respect to substrate temperature, the 4H—SiC and 6H—SiC polytypes are thermodynamically more stable than the metastable 3C—SiC polytype. The formation of hexagonal 4H— and 6H—SiC requires higher substrate temperature than that of 3C—SiC. The 3C—SiC is thermally unstable and may transform to more stable polytypes of 4H— and 6H—SiC at high temperature. However, the metastale 3C—SiC is the stable structure in nucleation stage and is always the first polytype that nucleates and occurs during growth at low temperatures below 1600° C. in accordance with the Ostwald step rule. Under non-equilibrium growth condition, where rearrangement of equilibrium growth is not possible, 3C—SiC is expected to be the final polytype even for growth at a high temperature (e.g. >2000° C.).

As for temperature gradient, high temperature gradient will lead to fast, non-equilibrium growth, which is in favor of 3C—SiC growth. On the contrary, low temperature gradient is in favor of 4H— and 6H—SiC growth.

Polarity of the substrate wafer is another factor to consider. The C face of the SiC substrate wafer is in favor of 4H—SiC growth, whereas the Si-face of the SiC substrate wafer is in favor of 3C—SiC and 6H—SiC growth.

For Si/C molar ratio in ambient (vapor phase stoichiometry), C-rich condition is in favor of 4H—SiC growth. Si-rich condition is in favor of 6H—SiC growth. Excess Si-rich condition is in favor of 3C—SiC growth.

With respect to impurities and doping, it is known that nitrogen doping may enhance the formation and stability of 4H—SiC polytype. The presence of certain impurities in the vapor phase (e.g., Ge, Sn, Pb, etc.) may be in favor of 4H—SiC growth.

In summary, the important operational parameters and functions required for the SSM prototype unit include: (1) high $\Delta T$ (>100° C.) and high T2 (>1750° C.) for fast growth rate, where high T2 is also in favor of 4H— and 6H—SiC polytypes; (2) controllable T1, T2 and $\Delta T$ for selective growth of different shapes and polytypes; (3) controllable vapor composition of the surrounding environment for selective growth of a specific SiC polytype, and for doping with desirable impurities; and (4) fast heating and cooling.

To achieve these parameters and functions, and to perform the SS method, the SSM heating system that was primarily designed for post-implantation annealing of ion-implanted SiC needs to be modified.

Modifications include, but are not limited to, introducing two optical temperature sensors to measure temperatures of both the source wafer and the substrate wafer; redesigning the wafer holder; designing a moving stage and other fixtures to facilitate the control of the gap (d) between the source and substrate wafers; and stabilizing $\Delta T$. In addition, a new environmental chamber will also be designed with a more compact size and better control of mass flow and pressure of the external vapor sources, which may play an important role in manipulating the composition, doping level and SiC polytype of the nanowires. To evaluate the modified unit and to determine the fundamental operational parameters, operational tests can be carried out. Furthermore, controlling features, such as a microcontroller (e.g., FPGM), may be added.

Figure 5:
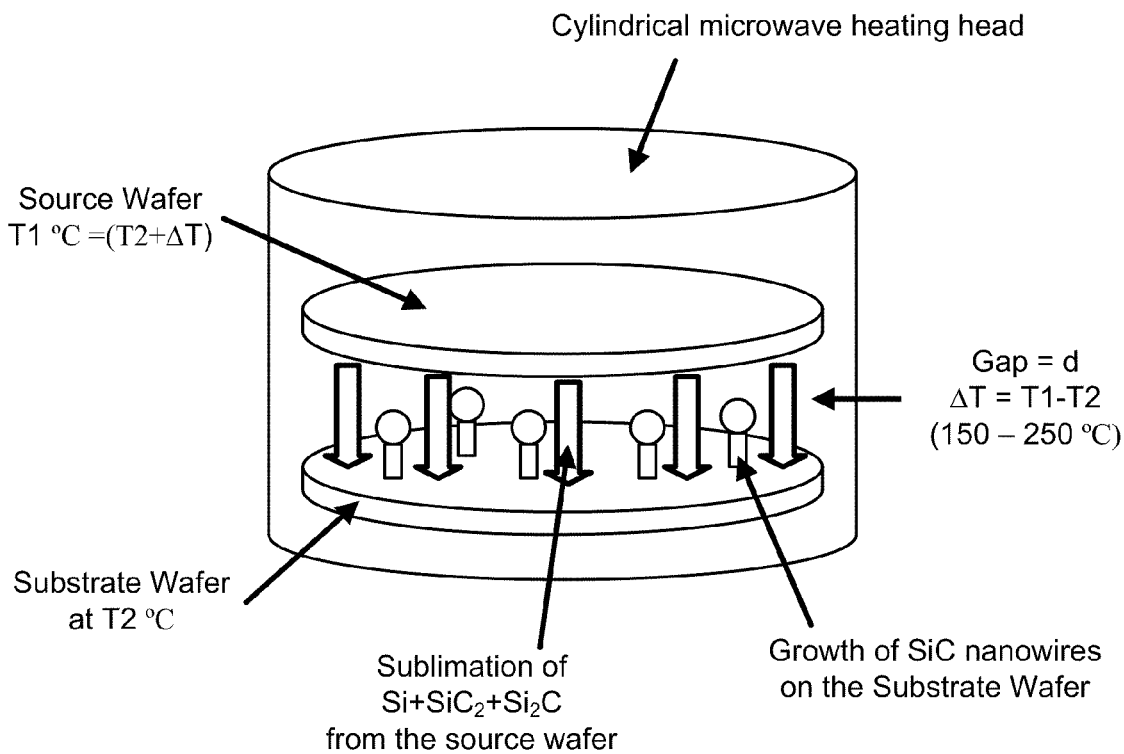
FIG. 5 shows a schematic example of the "sublimation-sandwich" cell used to grow SiC nanowires.

FIG. 5 shows a schematic of a typical "sandwich" cell employed in the present invention for SiC nanowire growth. The "sandwich cell" comprises two parallel 4H—SiC wafers with a very small gap, "d", between them. The bottom wafer is semi-insulating SiC, which will be referred to as the "substrate wafer" hereafter. The inner surface of the substrate wafer is coated with a 5 nm layer of Fe, Ni, Pd, or Pt that acts as a catalyst for the VLS growth of SiC nanowires. The top wafer is a heavily n-type (nitrogen doped) in-situ doped SiC, which will be referred to as the "source wafer". As further illustrated, the microwave heating head is placed around the sandwich cell. Due to the difference in electrical conductivity of the source wafer and the substrate wafer, at a given microwave power, the source wafer temperature is higher than the substrate wafer temperature, resulting in a temperature gradient, $\Delta T$ between the two wafers. When the Si- and C-containing species, such as Si, $SiC_2$, and $Si_2C$, sublimate from the source wafer at temperatures>1500° C., the temperature gradient $\Delta T$ provides the driving force for transporting these species to the substrate wafer. On the substrate wafer surface, the metal film is either already molten at the growth temperature, or it melts after absorbing the Si species and forms spherical islands to minimize its surface free energy. The Si- and C-containing vapor species are absorbed by these metal islands, converting them into liquid droplets of metal-Si—C alloys. Once this alloy reaches a saturation point for SiC, a precipitation of SiC occurs at the liquid-substrate interface thereby leading to a VLS growth of the SiC nanowires. The nanowires always terminate in hemispherical metal-Si alloy end-caps. While Group VIII metals facilitated growth of SiC nanowires, Au was unsuccessful as a catalyst in this VLS process. No traces of Au on the sample surface were found during a post-growth SEM/EDAX inspection, due to its possible evaporation at the growth temperature. The only results presented are those obtained using Fe as a metal catalyst since SiC growth using other Group VIII metals produced similar results.

2. Unique Features

The present invention's SS method can reliably grow SiC nanostructures with predictable morphologies and very high growth rates. As a result, there exists a vast body of information available for controlling the polytype, doping, orientation, etc. of the SiC growth. The sandwich cell used in this work is a nearly closed system because of the small gap between the source and substrates wafers, which allows precise control of the composition of the vapor phase in the growth cell. At the same time the system is open to the species exchange between the sandwich growth cell and the surrounding environment in the chamber. By appropriately adjusting the composition of the precursor species in the vapor, this approach has the potential to control the doping levels, or create heterostructures in the growing nanostructures. Another important feature of the sandwich growth cell is its compact size, which significantly reduces the volume of the surrounding chamber. The use of a small chamber not only saves the cost by utilization of small amount of expensive source materials, but also significantly reduces the vacuum pumping cycle time, which is needed for a high throughput fabrication. Yet another novel feature is the dynamic range of temperature ramping rates ($\geqq 600°$ C./s) that are possible using the microwave heating system. This is another process parameter which can be tweaked to circumvent some thermodynamic restrictions.

3. Experimental Parameters for SiC Nanostructure Growth

The substrate wafer temperature window for growing SiC nanostructures is 1250° C. to 1750° C. In this embodied experimental growth process, the precursor Si and C containing species sublimate from the source wafer. Significant sublimation of Si and C species from a SiC wafer requires temperatures>1400° C. (at 1 atm pressure). Therefore, the growth temperatures used are higher than those typically employed for SiC nanowire growth (1000° C.-1200° C.), since the previous works did not employ sublimated Si and C containing species from a SiC wafer as the source material.

The growth is performed for time durations of 15 s to 40 s. The $\Delta T$ between the source wafer and the substrate wafer is varied from 150° C. to 250° C. by varying the spacing (d) from 300 μm to 600 μm. All the growth experiments are performed in an atmosphere of UHP-grade nitrogen. Growth was also attempted in other inert gases, such as Ar, He, and Xe. But they were found to ionize due to the intense microwave field in the growth chamber.

4. Experimental Apparatus for Characterizing SiC Nanostructures

A Hitachi S-4700 FESEM was used for studying the surface morphology of the SiC nanowires. An EDAX attachment to the S-4700 microscope was used to determine chemical composition, and a HKL Nordlys II EBSD detector attached to the S-4700 microscope was used to collect the EBSD patterns. X-ray diffraction was performed using a Bruker D8 x-ray diffractometer equipped with an area detector. Samples for TEM were prepared by dispersing nanowires on lacey carbon-coated copper grids. The samples were examined in a Philips CM-30 TEM operated at 200 kV. Samples for μ-Raman spectroscopy were prepared by dispersing the SiC nanowires on an a-plane sapphire substrate. Raman spectra were obtained with 514.5 nm excitation (argon ion laser) in a back-scattering configuration using a custom-built Raman microprobe system. Incident laser radiation was delivered to the microprobe using a single mode optical fiber, resulting in a depolarized radiation exiting the fiber (no subsequent attempt was made to polarize the radiation). Radiation was introduced into the microscope optical path using an angled dielectric edge filter in the so-called injection-rejection configuration. Collected scattered radiation was delivered to a 0.5 m focal length imaging single spectrograph using a multimode optical fiber. A 100× infinity-corrected microscope objective was used for focusing incident radiation and collecting scattered radiation. Power levels at the sample were less than 1.6 mW. Light was detected with a back-illuminated, charge coupled device camera system operating at −90° C. The instrumental bandpass (FWHM) was approximately 3.1 $cm^{-1}$.

5. Morphology and Chemical Composition of SiC Nanowires

Figure 6:
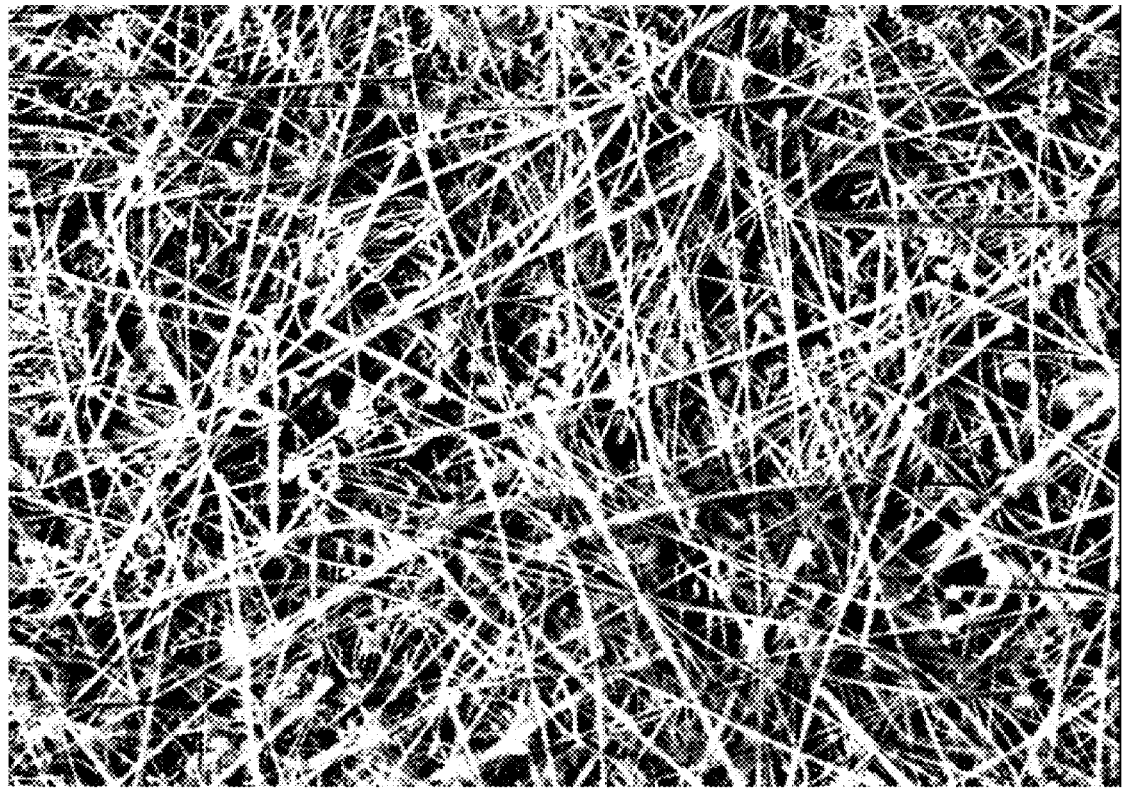
FIG. 6 shows an example of an FESEM image of SiC nanowires grown at $T_s$=1700° C. and $\Delta T$=150° C. for 40 s.

Growth of SiC nanowires was observed over a very narrow range of both substrate temperature '$T_s$' (1650° C.-1750° C.) and ΔT (≈150° C.). FIG. 6 shows a plan-view FESEM image of the nanowires grown at 1700° C. for 40 s. The growth and structural characterization of these nanowires, which are 10 μm to 30 μm long, is the main focus of this exemplified embodiment. Typical 3C—SiC nanowire lengths reported in the literature range from as short as 1 μm to as long as several mm. The diameters of the nanowires grown here are in the range of 15 nm to 300 nm. EDAX analysis of the nanowires (not shown) indicates that they mainly consist of Si and C with traces of nitrogen. The likely source of this nitrogen is the ambient atmosphere. However, the source wafer is also doped with nitrogen (ND=1×1019 $cm^{-3}$). The exact mechanism of the accommodation of nitrogen in SiC nanowires requires further investigation. EDAX spectra (not shown) from the droplets at the nanowire tips consist of the corresponding metal and Si.

Figure 7:
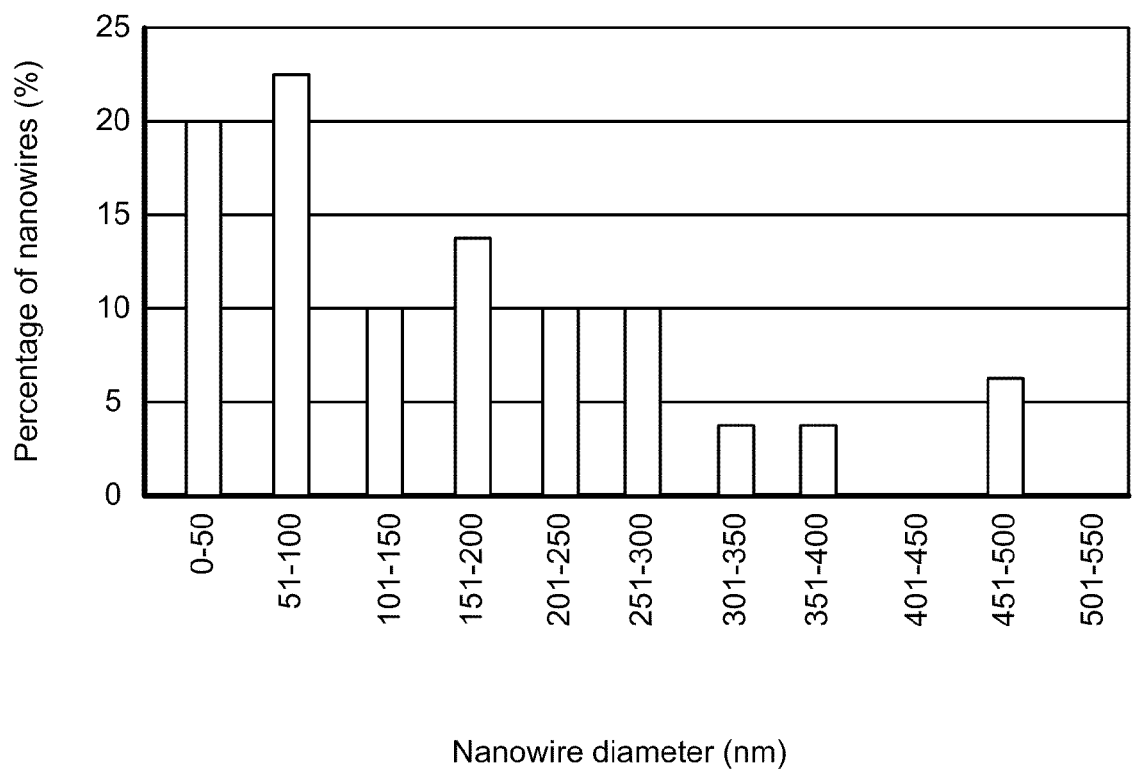
FIG. 7 shows an example of statistical distribution of the SiC nanowire diameters, where about 42% of the nanowires have diameters≦100 nm.

The statistical distribution of the nanowire diameters was determined using FESEM images of nanowire samples dispersed on a low-resistivity Si wafer. The diameters of 50 nanowires were measured at different locations on the wafer. As illustrated in FIG. 7, the diameter distribution for the SiC nanowires grown at 1700° C. for 40 s reveals that 42% of the nanowires exhibited diameters in the range of 15 nm to 100 nm, while 14% of nanowires had diameters in excess of 300 nm.

In addition to SiC nanowires, growth of cone-shaped and needle-shaped SiC nanostructures was also observed under different growth conditions. For ΔT=150° C., the substrate wafer temperatures in the range of 1250° C. to 1650° C. for 15 s to 1 min durations yielded mainly cone-shaped quasi 1-D SiC nanostructures, as shown in part (a) of FIG. 8. Such nanostructures are 2 μm-5 μm long. Yet, substrate wafer temperatures>1750° C. for the same durations resulted in micron-sized SiC deposits (not shown). In part (a) of FIG. 8, the "nanocones" taper off along their axis from thick catalytic metal tips. This suggests that the diameter of the droplets increased during the growth of the cones. The diameters of their thin ends are about 10 nm to 30 nm, while the broad portion at the top just under the catalytic metal tips, range from 100 nm to 200 nm. The fact that the diameter of the cones increases with growth duration must mean that there is an Oswald ripening effect (i.e., the metal is transferred from the smaller diameter droplets to the larger diameter ones, possibly via surface diffusion). The short length of the cones results from a relatively low SiC growth rate for the experimental conditions under which the cones are grown. Thus, the surface diffusion length for the liquid metal to flow from the smaller diameter droplets to the larger diameter droplets is short.

Figure 8:
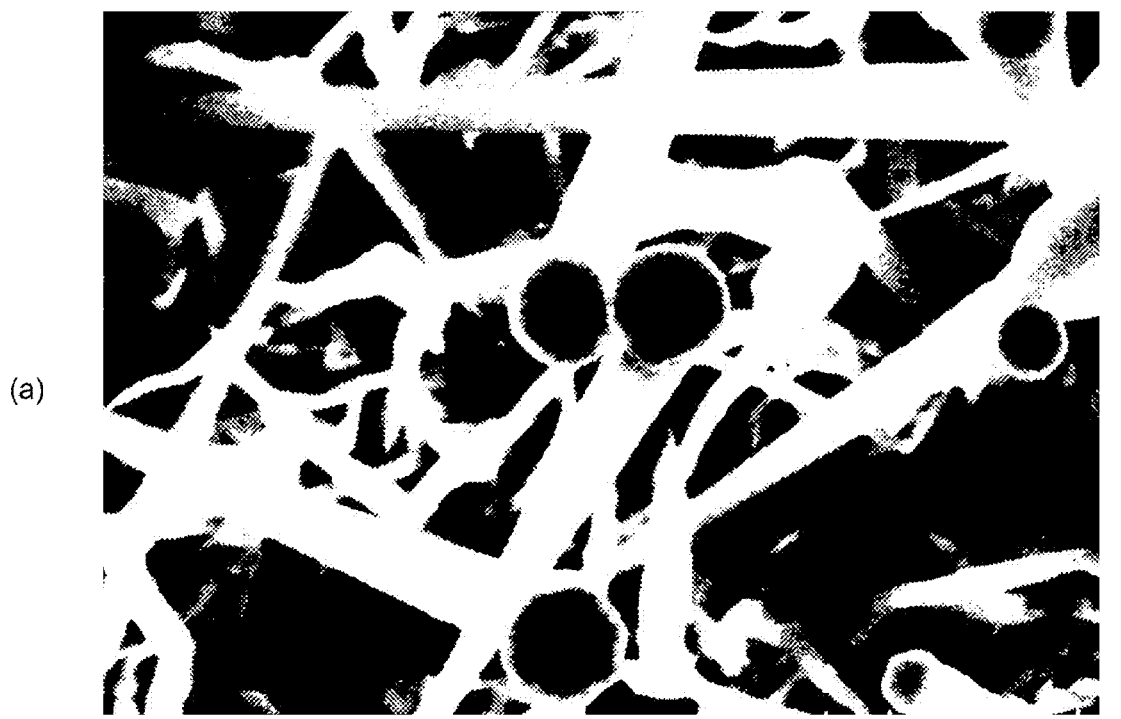
FIG. 8 shows an examples of (a) cone-shaped SiC nanostructures grown at $T_s$=1600° C. and $\Delta T$=150° C., and (b) needle-shaped SiC nanostructures grown at $T_s$=1700° C. and $\Delta T$=250° C.
Figure 8:

As shown in part (b) of FIG. 8, increasing the ΔT to 250° C. (by increasing 'd' from 300 μm to 600 μm) at a $T_s$ of 1700° C. resulted in mainly needle-shaped SiC nanostructures, which are 50 μm-100 μm in length. These needles are narrow under the catalytic metal tips. It is obvious that the diameter of the metal droplets catalyzing the needle growth decreases with growth duration. Because the source wafer temperature for needle growth (1900° C.-2000° C.) is the highest among the temperatures explored in this exemplified embodiment, it is possible that the metal droplets evaporate during crystal growth due to high temperatures in the vicinity of the droplets. The much longer needles (in comparison with the cones) also result in a greater surface diffusion length for the liquid metal to flow between droplets, which might have inhibited significant surface diffusion of the metal.

6. Crystallography of SiC Nanowires

Figure 9:
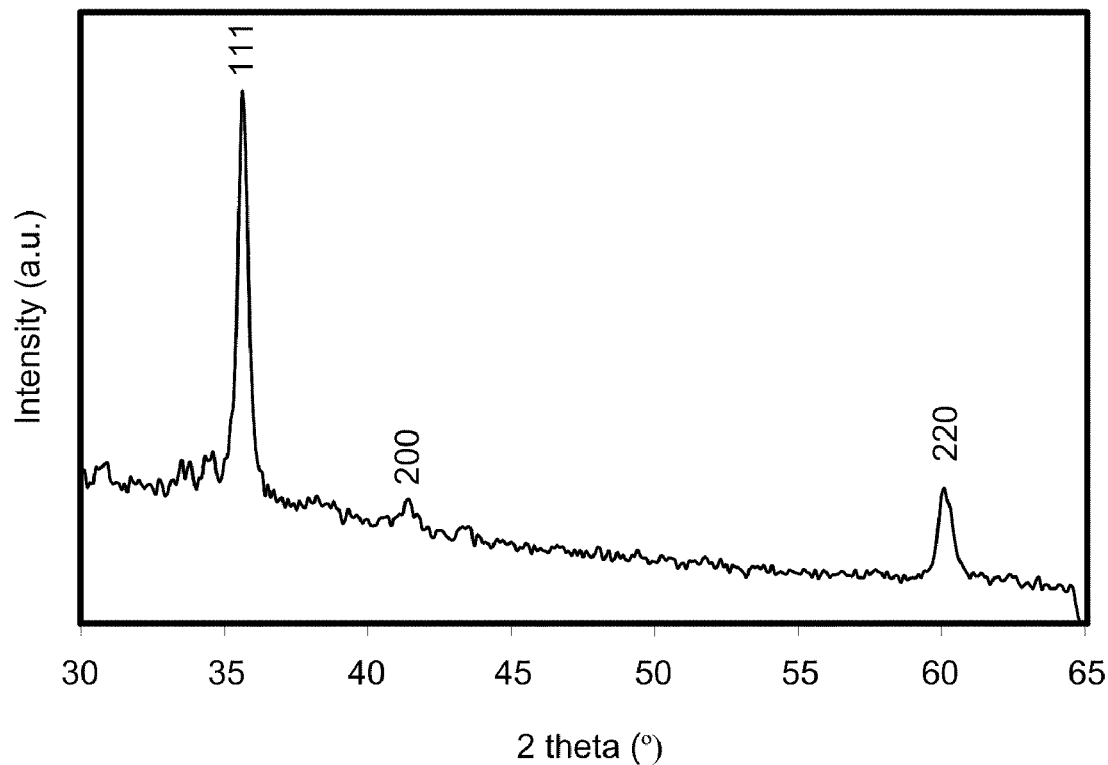
FIG. 9 shows an example of a typical x-ray diffraction spectrum obtained from the SiC nanowires grown.

FIG. 9 shows a typical θ-2θ powder x-ray diffraction spectrum obtained from the SiC nanowires. The only phase unambiguously identified from the XRD spectrum is 3C—SiC.

Figure 10:
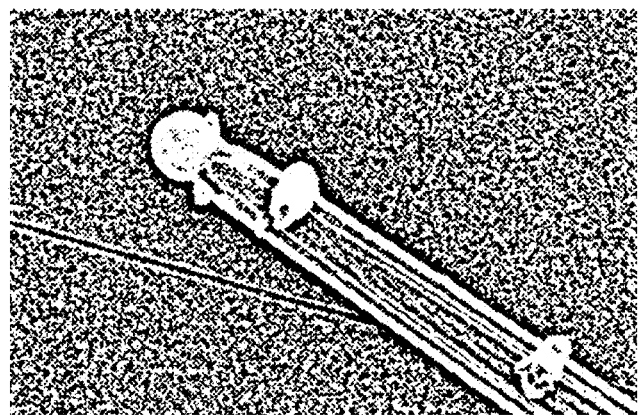
FIG. 10 shows examples of (a) FESEM image of a SiC nanowire harvested on a heavily doped Si substrate, (b) EBSD pattern from the nanowire indexed to the 3C—SiC phase, and (c) EBSD pattern from the nanowire tip indexed to $Fe_2Si$.
Figure 10:
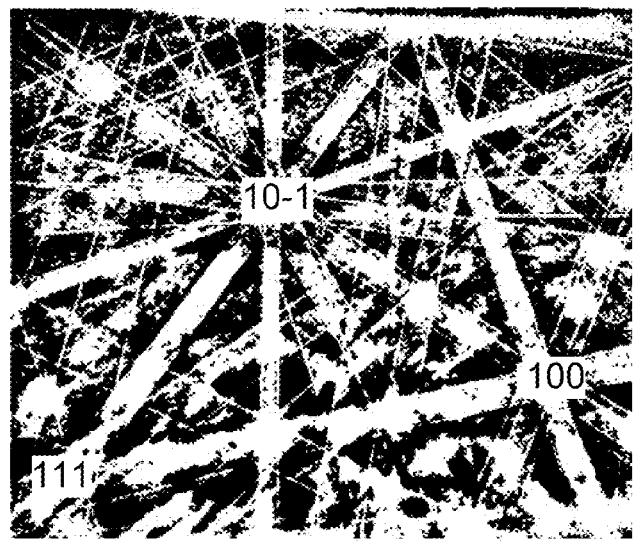
Figure 10:
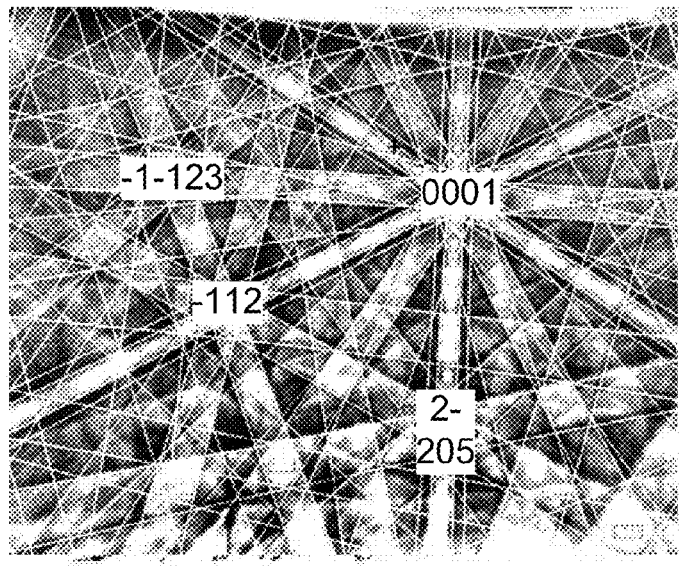

FIG. 10 shows three parts. Part (a) shows an FESEM image of a SiC nanowire harvested on a heavily doped Si substrate. Parts (b) and (c) respectively show EBSD patterns from the SiC nanowire and catalytic cap. The EBSD pattern from the nanowire was successfully indexed to 3C SiC and not one of the hexagonal variants (2H, 4H, etc.) or rhombohedral variants (e.g. 15R). This distinction relies on the presence and/or absence of relatively weak lines in the EBSD spectra, but the result was unequivocal. The growth direction of the nanowire was identified as ⟨112⟩, which is in contrast to the ⟨111⟩ growth direction commonly observed for 3C SiC nanowires. The EBSD pattern from the catalytic tip of the SiC nanowire, which clearly shows the six-fold symmetry about the c-axis, was indexed according to the hexagonal $Fe_2Si$ phase. One of the reasons as to why the ⟨112⟩ growth direction is preferred for the SiC nanowires grown in this work over the commonly reported ⟨111⟩ direction could be the very high temperatures (1650° C.-1750° C.) used in this work for nanowire growth. The nanowire growth generally occurs along the direction, whose corresponding face has the highest surface energy, so that that particular face is not exposed. The {111} being a three cluster face must have a higher surface energy for SiC at lower temperatures, thereby driving the nanowire growth along the ⟨111⟩ direction. At higher temperatures, the nucleation rate along directions normal to lower atomic density planes such as {110} and {112} is known to be faster than {111}. It has been observed that 3C—SiC nanowire growth direction switched from ⟨111⟩ to ⟨110⟩, when the growth temperature was increased beyond 1500° C.

The occurrence of different polytypes dependent on the temperature has been studied in sublimation experiments under near-equilibrium conditions. Factors affecting the crystal polytype are the temperature and the pressure in the growth chamber, the polarity of the seed crystal, the presence of certain impurities and the Si/C ratio. Under more Si-rich (or C-rich) conditions the formation of the cubic (or hexagonal) polytype should be preferred. Nucleation far from equilibrium conditions and a nitrogen atmosphere has been generally assumed to stabilize the cubic polytype. This effect is supported by nucleation theory. Furthermore, 3C SiC has the lowest surface energy among all polytypes. Since, in the experiments, Si-rich precursor species are present (Si, $Si_2C$), and nucleation occurs far from equilibrium conditions in a nitrogen atmosphere, the growth of 3C—SiC is to be expected from the above considerations. Furthermore, because nanowires have a large surface to volume ratio, the low surface energy of the 3C—SiC polytype makes it much more favorable to grow 3C—SiC over other polytypes.

As mentioned before, SiC nanowire growth was successfully performed by using other Group VIII metal catalysts (such as Ni, Pd, and Pt) in addition to Fe. In each case, the EBSD patterns from the nanowires were indexed to 3C—SiC and the growth direction of the nanowire was identified as parallel to the ⟨112⟩ crystallographic directions, which indicates the unique ⟨112⟩ growth direction observed for SiC nanowire growth in this work does not depend on the metal catalyst used for the growth. EBSD patterns from the endcaps of the SiC nanowires grown using (a) Ni catalyst, (b) Pd catalyst, and (c) Pt catalyst, may be taken. These catalysts were respectively indexed to $Ni_3Si$, $Pd_2Si$, and PtSi phases.

It should be noted that a much higher density of nanowires in comparison with other 2-D deposits are observed for the growth performed using Fe, Ni, and Pd. It was still possible to grow SiC nanowires using Pt as well. But the yield of the nanowires in comparison with other 2-D deposits was much lower. This lower yield can be possibly attributed to the higher melting point of the Pt—Si alloys compared to other metals used in these embodiments. However, no major difference in the structural characteristics of the nanowires grown using the different metal catalysts were observed.

A representative <101> selected area electron diffraction pattern may be recorded from a single SiC nanowire, where the reflections are indexed according to the F-centered cubic 3C—SiC unit cell. The recording were all consistent with a cubic 3C—SiC structure. The growth direction is parallel to ⟨112⟩, as was inferred from the nanowire projections in several zone axis orientations, which is consistent with EBSD results.

Figure 11:
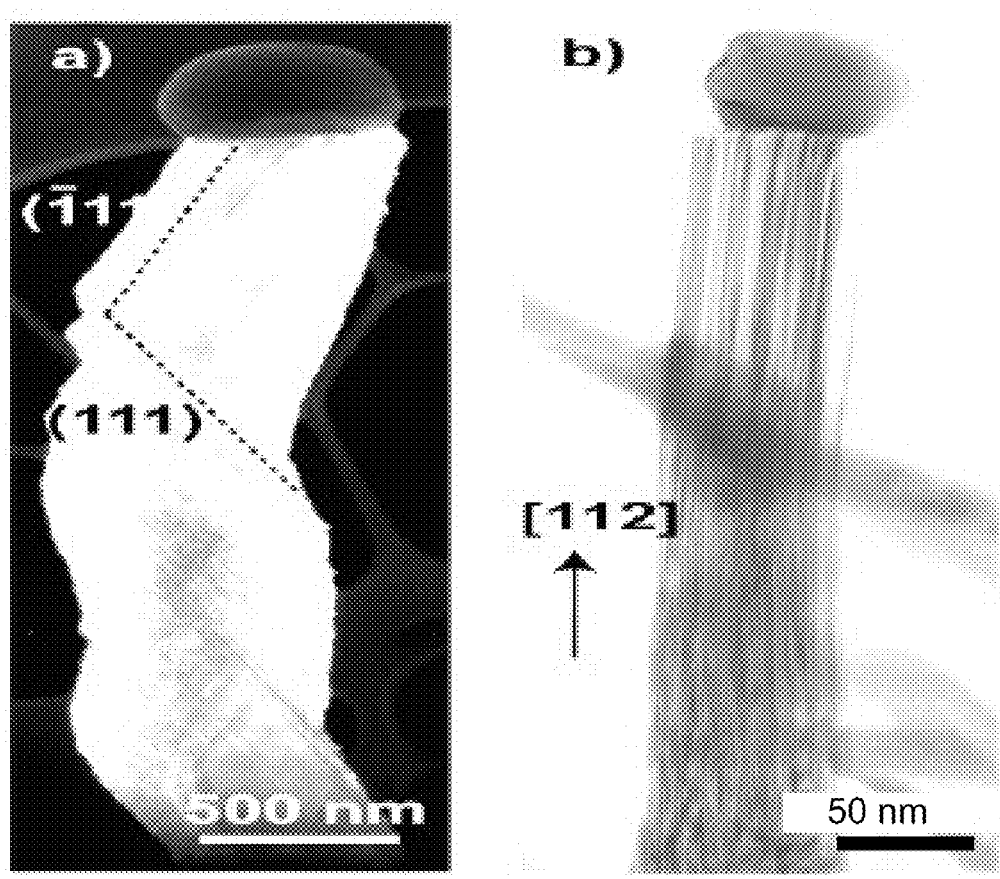
FIG. 11 shows examples of diffraction contrast TEM images of two types of 3C—SiC nanowires, with (a) being twin-like defects are observed on different sets of {111} planes, and (b) being high-incidence of planar defects parallel to {111} planes along the wire axis.

FIG. 11 shows at-least two different types of SiC nanowires were observed under TEM. Also shown are diffraction contrast TEM images representative of these two types of nanowires. The nanowire shown in part (a) exhibits twinning on four non-equivalent {111} planes, with the growth direction switching among the ⟨112⟩ directions in these planes (≈70° apart), which creates an impression of nanowire bending. The twinning was confirmed through the selected area electron diffraction patterns (not shown). The nanowire shown in part (b) is relatively straight but features a high-incidence of planar {111} defects (presumably, stacking faults and/or twins) parallel to the growth axis. These defects produced streaks of diffuse intensity along the <111> direction in electron diffraction patterns. It should be noted that even though an image of a thin (50 nm diameter) straight nanowire and a thick (500 nm diameter) bent nanowire are illustrated, the nanowire diameter has no bearing on whether a nanowire is straight or bent. Thick, straight nanowires and thin bent nanowires have also been observed.

7. Raman Study of SiC Nanowires

Figure 12:
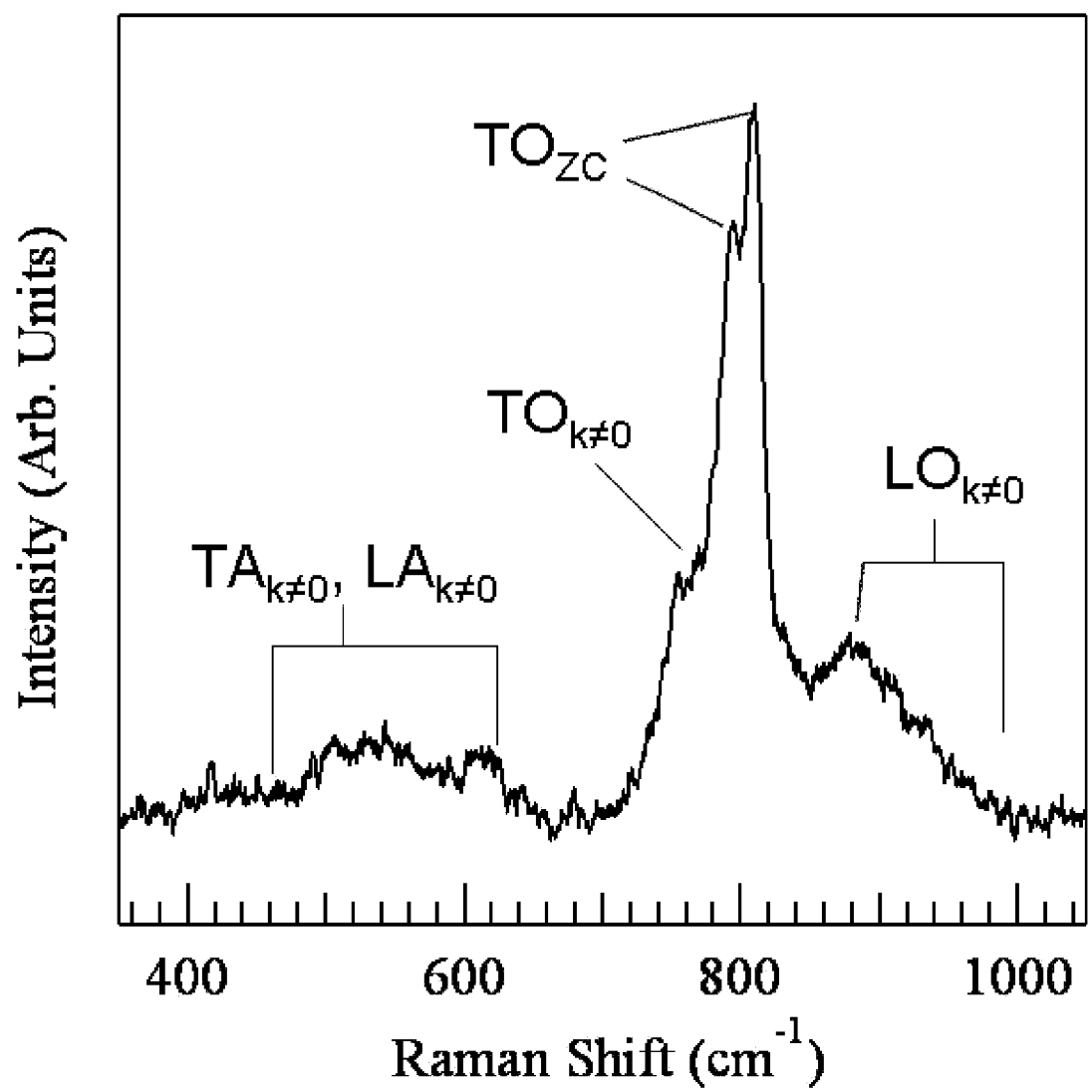
FIG. 12 shows an example of μ-Raman spectrum from an isolated SiC nanowire.

FIG. 12 shows a typical micro-Raman spectrum obtained from an isolated SiC nanowire. The most intense feature is observed at ≈800 $cm^{-1}$ and is attributed to zone center transverse optical (TO) phonon modes in 3C—SiC. This feature is composed of at least two peaks with center wavenumbers of ≈794 $cm^{-1}$ and ≈810 $cm^{-1}$ (obtained by performing a peak deconvolution assuming only two peaks) and exhibits a shoulder at ≈756 $cm^{-1}$. In comparison, bulk 3C—SiC Raman spectra exhibit only one TO mode at ≈796 $cm^{-1}$. The TO phonon mode at 794 $cm^{-1}$ in the nanowire spectrum is comparable with bulk 3C—SiC. However, the appearance of a second TO phonon mode at 810 $cm^{-1}$ in the nanowire spectrum indicates that there are regions in the nanowire under compressive strain. A relatively large increase in the SiC TO phonon wavenumber (≈5 $cm^{-1}$ to ≈6 $cm^{-1}$) has been reported in 3C—Sic grown on TiC and attributed to compressive strain in the SiC layer. A likely cause of the strain is the presence of planar defects in the nanowires, as identified by TEM. It is possible that either the low-strain region grows with a lower defect concentration than the high-strain region or that the defect concentration is high enough to lead to strain relaxation in the low-strain region.

Broader, weaker features observed at ≈480 $cm^{-1}$ to ≈640 $cm^{-1}$ and ≈820 $cm^{-1}$ to ≈980 $cm^{-1}$ are attributed to scattering by phonon modes originating from other than the Brillouin zone center. In pure, perfect crystals, only zone center optical phonon modes should be allowed for the scattering conditions employed in these embodiments. However, this restriction can be relaxed due to the presence of defects which destroy translational symmetry. The resulting Raman spectrum exhibits features of the phonon density of states rather than only zone center phonon modes. Hence, the ≈480 $cm^{-1}$ to ≈640 $cm^{-}$, ≈820 $cm^{-1}$ to ≈980 $cm^{-1}$, and ≈756 $cm^{-1}$ features are attributed to defect-induced acoustic (transverse and longitudinal) phonon mode scattering, LO phonon mode scattering, and TO phonon mode scattering, respectively, from throughout the Brillouin zone. Surface optical phonon modes may also contribute to the signal observed in ≈900 $cm^{-1}$ to ≈980 $cm^{-1}$ range. No longitudinal optical (LO) phonon modes are observed. This lacking is consistent with previously reported SiC nanowire spectra obtained in this geometry.

C. Summary

In summary, a novel technique for the controlled rapid growth of 1-D nanostructures of 3C—SiC using various Group VIII transition metal catalysts has been developed. The experimental parameters that dictate the growth of faceted nanowires (with straight sidewalls), nanoneedles and nanocones (with tapering sidewalls) have been identified. The nanowires are found to grow by the VLS mechanism at substrate temperatures in the range of 1650° C.-1750° C., for growth durations of 15 s-40 s, along the ⟨112⟩ crystallographic directions. TEM studies have indicated the presence of two types of nanowires, one type maintains a constant growth direction, and another type frequently changes its growth direction by twinning. Also, several stacking faults running along the length of the nanowires have been identified. Micro-Raman spectra of the SiC nanowires, in addition to confirming the 3C-polytype, also indicate the presence of regions exhibiting different compressive strain in the nanowire as well as non Brillouin zone-center modes.

III. REFERENCES

PROCESS TECHNOLOGY FOR SILICON CARBIDE DEVICES (C-M. Zetterling ed., 2002).

ADVANCES IN SILICON CARBIDE PROCESSING AND APPLICATIONS (S. E. Saddow & A. K. Agarwal eds., 2004).

Y. Huang et al., 76 PURE APPL. CHEM. 2051-68 (2004).

M. Law et al., 34 ANN. REV. MATER. RES. 83-122 (2004).
W. Z. Li et al., 274 SCI. 1701-03 (1996).
W. Q. Han et al., 277 SCI. 1287-89 (1996).
A. M. Morales & C. M. Lieber, 279 SCI. 208-11 (1998).
J. Y. Fan et al., 51 PROG. MATER. SCI. 983 (2006).
Z. S. Wu et al., 80 APPL. PHYS. LETT. 3829-31 (2002).
H. F. Zhang et al., 2 NANO LETT. 941-44 (2002).
X. Wu et al., 36 MATER. RES. BULL. 847-52 (2001).
R. Pampuch et al., 31 GLASS PHYS. CHEM. 370-76 (2005).
W. Shi et al., 83 J. AM. CERAM. SOC. 3228-30 (2000).
Y. J. Xing et al., 345 CHEM. PHYS. LETT. 29-32 (2001).
F. Yan et al., 53 SCR. MATER. 361-65 (2005).
A. J. Winn & R. I. Todd, 98 BR. CERAM. TRANS. 219-24 (1999).
S. M. Dong et al., 36 J. MATER. SCI. 2371-81 (2001).
P. G. Neudeck, 24 J. ELEC MATER. 283-88 (1995).
Y. W. Ryu & K. J. Yong, 23 J. VAC. SCI. TECHNOL. B 2069-72 (2005).
Y. Baek et al., 26 MATER. SCI. ENG'G C 805-08 (2006).
S. Z. Deng et al., 356 CHEM. PHYS. LETT. 511-514 (2002).
W. M. Zhou et al., 252 APP. SURF. SCI. 5143-48 (2006).
F. Li et al., 290 J. CRYS. GROWTH 466-72 (2006).
H-J. Choia et al., 269 J. CRYS. GROWTH 472-78 (2004).
V. A. Izhevskyi et al., 46 CERAMICA 1-29 (2000).
R. S. Wagner & W. C. Ellis, 4 APPL. PHYS. LETT. 89-90 (1964).
J. B. Hannon et al., 440 NATURE 69-71 (2006).
W. F. Knippenberg, 18 PHILIPS RES. REP. 161-274 (1963).
M. Omuri et al., 28 JAPAN. J. APPL. PHYS. 1217 (1989).
V. Heine et al., 74 J. AM. CERAM. SOC. 2330-33 (1991).
S. Limpijumnong & W. R. L. Lambrecht, 57 PHYS. REV. B 12017 (1998).
Y. M. Tairov & V. F. Tsvetkov, 52 J. CRYST. GROWTH 146-50 (1981).
H. Nakashima & H. Harima, 162 PHYS. STAT. SOL. A 39-64 (1997).
H. Harima et al., 36 JAPAN. J. APPL. PHYS. 5225-31 (1997).
J. Frechette & C. Carraro, 128 J. AM. CHEM. SOC. 14774-75 (2006).
J. Frechette & C. Carraro, 74 PHYS. REV. B 161404-07 (2006).
Z. J. Li et al., 110 J. PHYS. CHEM. B 22382-86 (2006).
R. Merlin et al., RAMAN SCATTERING IN MATERIALS SCIENCE 1-29 (W. H. Weber & R. Merlin eds., 42 ed., 2000).
K. Karch et al., 50 PHYS. REV. B 17054-63 (1994).
D. Olego and M. Cardona, 25 PHYS. REV. B 1151-60 (1982).
J. F. Digregorio & T. E. Furtak, 89 SOLID ST. COMMS. 163-68 (1994).

IV. STATEMENTS

While various embodiments have been described above, it should be understood that they have been presented by way of example, and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. Thus, the present embodiments should not be limited by any of the above described exemplary embodiments.

In addition, it should be understood that any figures which highlight the functionality and advantages, are presented for example purposes only. The disclosed architecture is sufficiently flexible and configurable, such that it may be utilized in ways other than that shown. For example, the steps listed in any flowchart may be re-ordered or only optionally used in some embodiments.

Further, the purpose of the Abstract of the Disclosure is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract of the Disclosure is not intended to be limiting as to the scope in any way.

Finally, it is the applicant's intent that only claims that include the express language "means for" or "step for" be interpreted under 35 U.S.C. 112, paragraph 6. Claims that do not expressly include the phrase "means for" or "step for" are not to be interpreted under 35 U.S.C. 112, paragraph 6.

What is claimed is:

1. A microwave-based sublimation-sandwich silicon carbide (SiC) polytype growth method comprising:
   a. creating a sandwich cell by placing a source wafer parallel to a substrate wafer, leaving a small gap between the source wafer and the substrate wafer;
   b. placing a microwave heating head around the sandwich cell to selectively heat the source wafer to a source wafer temperature and the substrate wafer to a substrate wafer temperature;
   c. creating a temperature gradient between the source wafer temperature and the substrate wafer temperature;
   d. sublimating silicon (Si-) and carbon (C-) containing species from the source wafer, producing Si- and C-containing vapor species;
   e. converting the Si- and C-containing vapor species into liquid droplets of metal-ion alloys by allowing the substrate wafer to absorb the Si- and C-containing vapor species; and
   f. growing nanostructures on the substrate wafer once the alloys reach a saturation point for SiC.

2. The method according to claim 1, wherein the SiC polytype is a hexagonal SiC or cubic SiC.

3. The method according to claim 1, wherein the source wafer is an n-type or p-type doped SiC.

4. The method according to claim 1, wherein the substrate wafer is a semi-insulating SiC or at least one order less doped SiC compared to the source wafer.

5. The method according to claim 1, wherein the small gap is at least about 0.3 mm.

6. The method according to claim 1, wherein the inner surface of the substrate wafer is coated with a catalyst, creating a catalyst layer.

7. The method according to claim 6, wherein the catalyst layer is a patterned layer.

8. The method according to claim 1, wherein the sandwich cell and the microwave heating head are in a vacuum chamber or in a dopant gas atmosphere.

9. The method according to claim 1, wherein the substrate wafer temperature is greater than or about equal to the melting point of the catalyst, and the temperature gradient is at least about 100° C.

10. The method according to claim 1, wherein a heating rate is at least about 100° C./s and a cooling rate is at least about 100° C./s.

11. The method according to claim 1, further including controlling the morphology of the nanostructures by varying the substrate wafer temperature and the temperature gradient.

12. The method according to claim 1, further including controlling the SiC polytype growth by varying the substrate wafer temperature and polarity of the substrate wafer.

13. The method according to claim 12, wherein the polarity is Si-face or C-face.

14. The method according to claim 1, further including controlling the SiC polytype growth by varying vapor phase composition.

15. The method according to claim 14, wherein the vapor phase composition includes an Si/C molar ratio in ambient and impurities.

16. The method according to claim 1, further including controlling the morphology of the nanostructures by selecting a source wafer with at least one dopant.

17. The method according to claim 16, wherein the dopant is aluminum, nitrogen, or a combination thereof.

18. A sublimation-sandwich silicon carbide (SiC) polytype growth method comprising:
   a. creating a sandwich cell by placing a source wafer parallel to a substrate wafer, leaving a small gap between the source wafer and the substrate wafer;
   b. placing a heating unit around the sandwich cell to selectively heat the source wafer to a source wafer temperature and the substrate wafer to a substrate wafer temperature;
   c. creating a temperature gradient between the source wafer temperature and the substrate wafer temperature;
   d. sublimating silicon (Si-) and carbon (C-) containing species from the source wafer, producing Si- and C-containing vapor species;
   e. converting the Si- and C-containing vapor species into liquid droplets of metal-ion alloys by allowing the substrate wafer to absorb the Si- and C-containing vapor species; and
   f. growing nanostructures on the substrate wafer once the alloys reach a saturation point for SiC.

19. The method according to claim 18, wherein the SiC polytype is a hexagonal SiC or cubic SiC.

20. The method according to claim 18, wherein the inner surface of the substrate wafer is coated with a catalyst, creating a catalyst layer.

* * * * *